US008083370B2

(12) United States Patent
Sloan et al.

(10) Patent No.: US 8,083,370 B2
(45) Date of Patent: Dec. 27, 2011

(54) LOW PROFILE EXTRUSION

(75) Inventors: Thomas C. Sloan, Santa Barbara, CA (US); Bruce Quaal, Ventura, CA (US)

(73) Assignee: The Sloan Company, Inc., Ventura, CA (US)

( * ) Notice: Subject to any disclaimer, the term of this patent is extended or adjusted under 35 U.S.C. 154(b) by 78 days.

(21) Appl. No.: 12/454,101

(22) Filed: May 11, 2009

(65) Prior Publication Data

US 2010/0238655 A1 Sep. 23, 2010

Related U.S. Application Data

(60) Provisional application No. 61/127,039, filed on May 9, 2008.

(51) Int. Cl.
*F21S 4/00* (2006.01)
*F21V 11/00* (2006.01)
*F21V 1/00* (2006.01)
*H05K 13/00* (2006.01)

(52) U.S. Cl. ........ 362/225; 362/219; 362/221; 362/223; 362/249.02; 362/249.07

(58) Field of Classification Search .................. 362/219, 362/221, 223, 646, 249.02, 249.03, 249.07, 362/225

See application file for complete search history.

(56) References Cited

U.S. PATENT DOCUMENTS

| | | | | |
|---|---|---|---|---|
| 4,439,818 | A | 3/1984 | Scheib | 362/250 |
| 5,559,681 | A | 9/1996 | Duarte | 362/252 |
| 5,678,335 | A | 10/1997 | Gomi | 40/550 |
| 6,042,248 | A | 3/2000 | Hannah | 362/252 |
| 6,796,680 | B1 * | 9/2004 | Showers et al. | 362/246 |
| 7,267,461 | B2 * | 9/2007 | Kan et al. | 362/373 |
| 2006/0087838 | A1 * | 4/2006 | Grajcar | 362/227 |
| 2009/0027916 | A1 * | 1/2009 | Huang et al. | 362/581 |
| 2010/0187005 | A1 * | 7/2010 | Yeh | 174/268 |
| 2011/0007514 | A1 * | 1/2011 | Sloan et al. | 362/368 |

FOREIGN PATENT DOCUMENTS

WO WO 9906759 2/1999

OTHER PUBLICATIONS

Related patent information, U.S. Appl. No. 12/321,422, "Led Drive Circuit", filed on Jan. 20, 2009, Thomas C. Sloan.

* cited by examiner

*Primary Examiner* — Stephen F Husar
*Assistant Examiner* — James Cranson, Jr.
(74) *Attorney, Agent, or Firm* — Koppel, Patrick, Heybl & Philpott

(57) ABSTRACT

The present invention provides various embodiments for apparatuses and methods of manufacturing low profile housings for electronic and/or optoelectronic devices. Some embodiments provide low profile housings with a hollow casing comprising a first surface, second surface, and at least one lateral side surface. The housing is substantially light-diffusive. At least one cap is provided for sealing an end of the casing, with the at least one cap being sized to account for variations in the casing. At least one light emitting device, such as an LED, may be mounted within the casing. A mounting means may be included for mounting the housing. In another embodiment, a low profile housing with a first casing and second casing surrounding a majority of the first casing may be provided. At least one light emitting device, such as a double-sided printed circuit board with a plurality of LEDs, may be provided in the first casing. One or more end caps may be provided for sealing both the first and second casings. Two different wavelengths of light may be emitted from either side of the housing.

29 Claims, 9 Drawing Sheets

FIG. 1
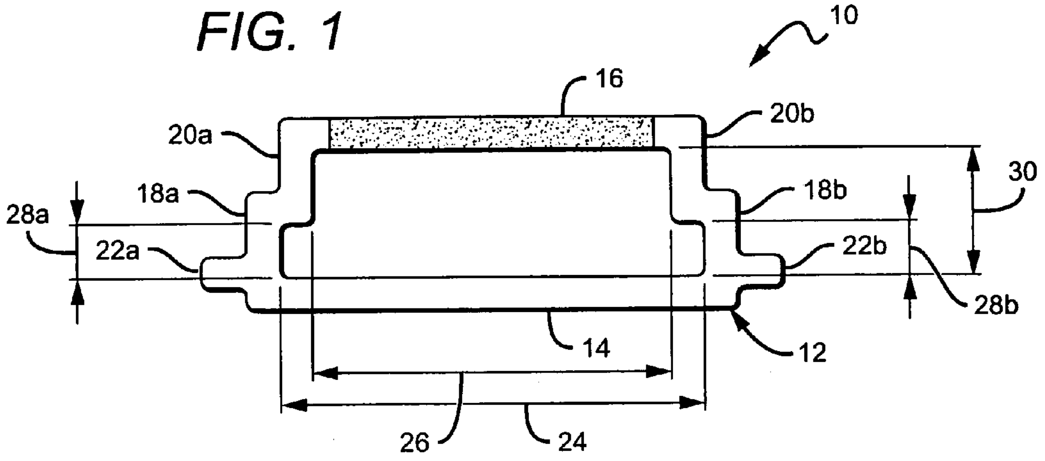
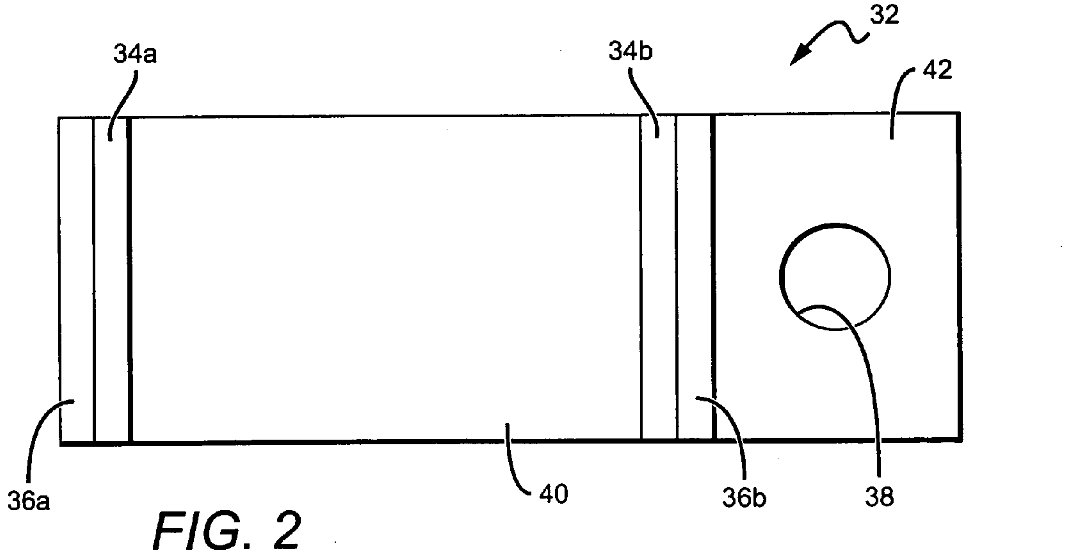
FIG. 2
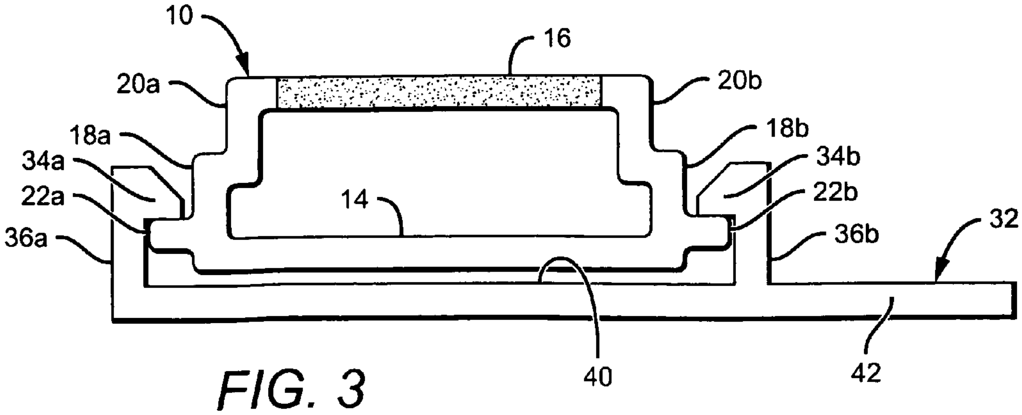
FIG. 3

FIG. 4
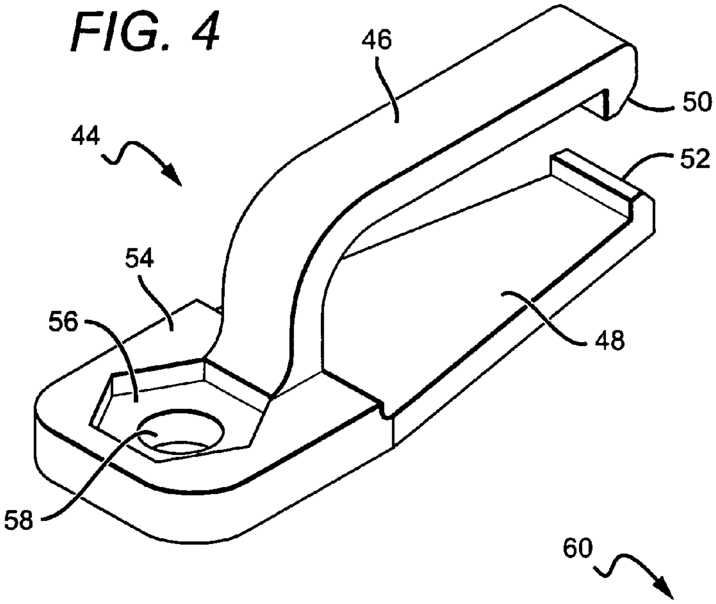
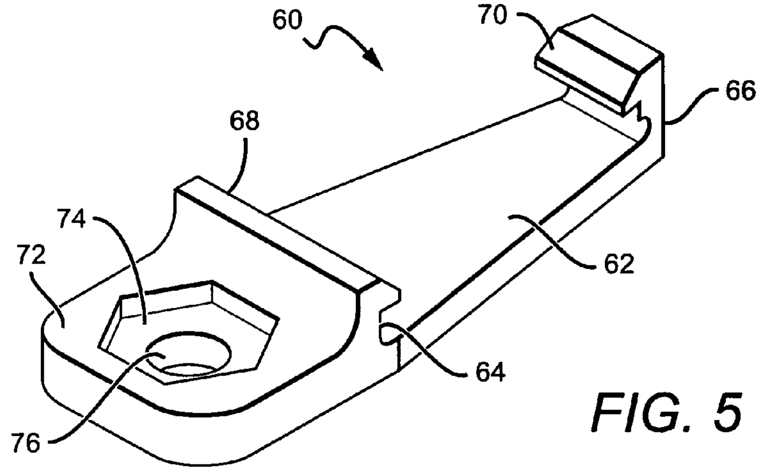
FIG. 5
FIG. 15
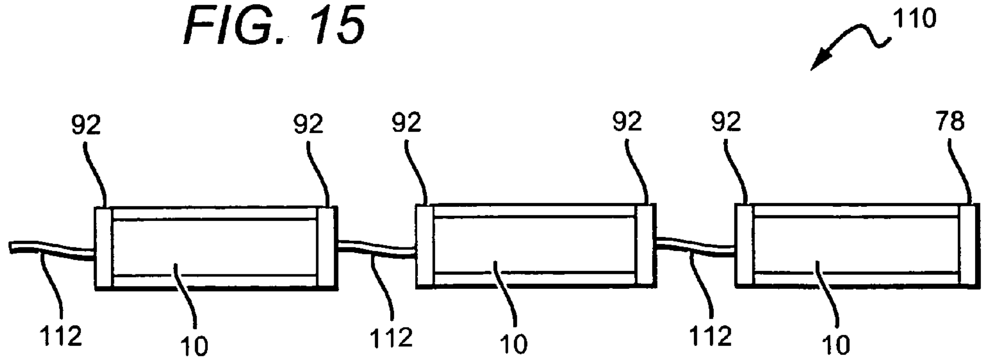

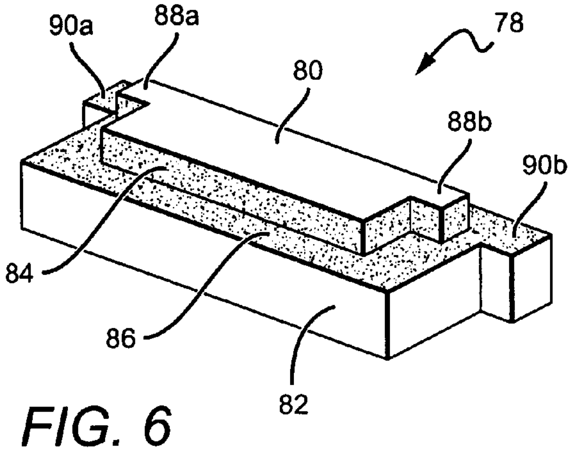
FIG. 6
FIG. 7
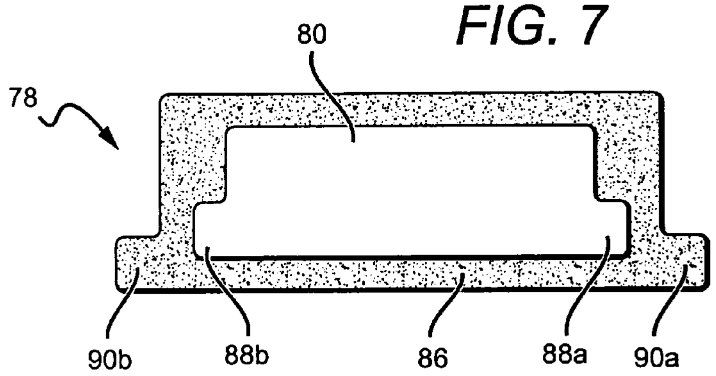
FIG. 8
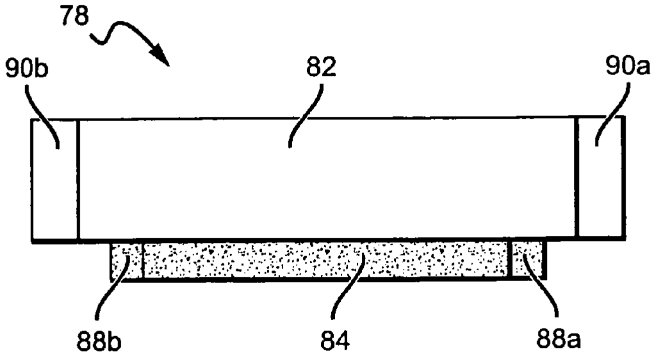
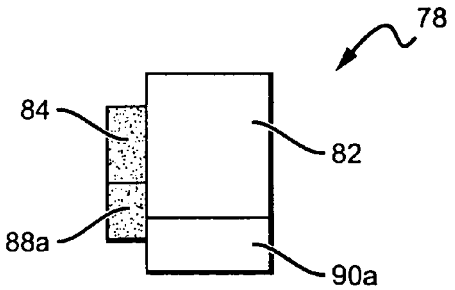
FIG. 9

FIG. 18
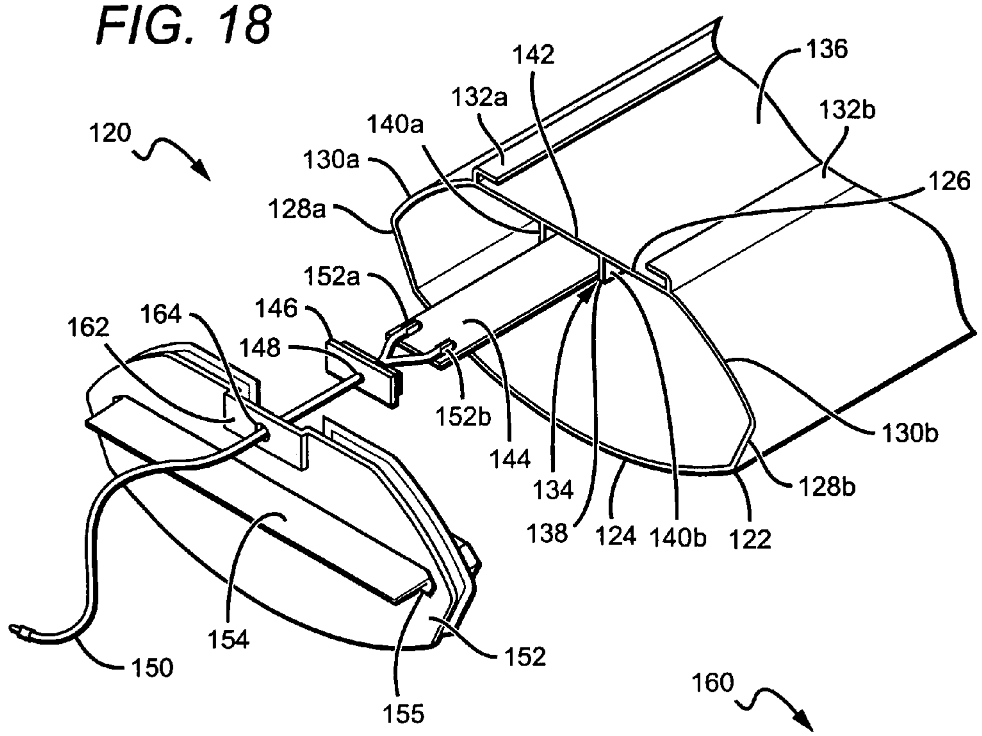
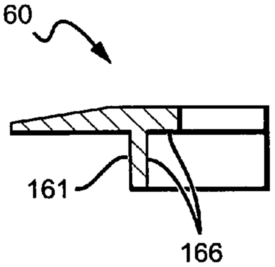
FIG. 19b
FIG. 19a
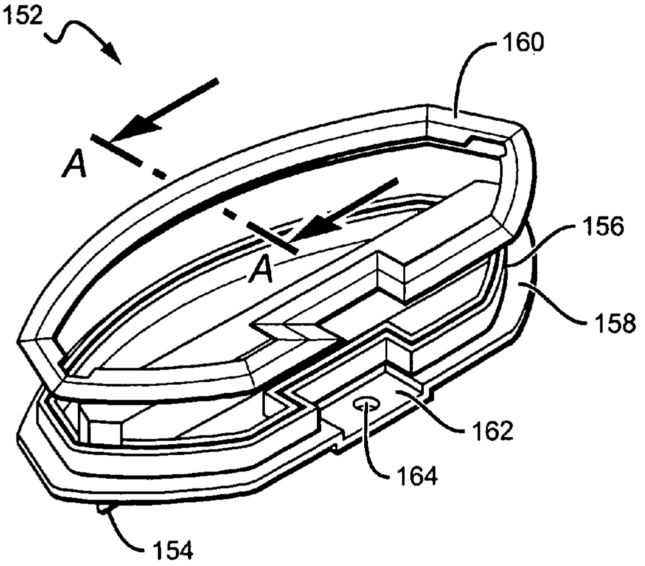

FIG. 20a
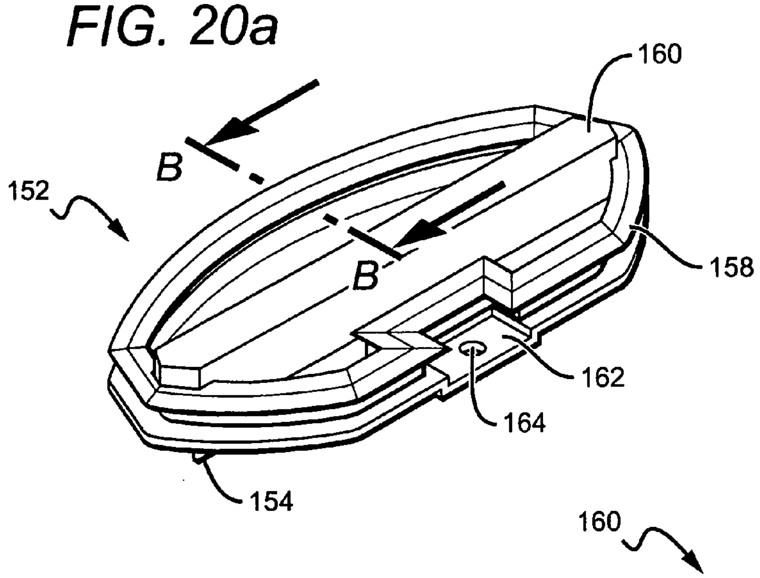
FIG. 20b
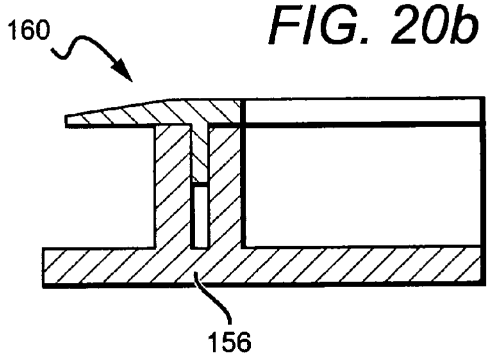
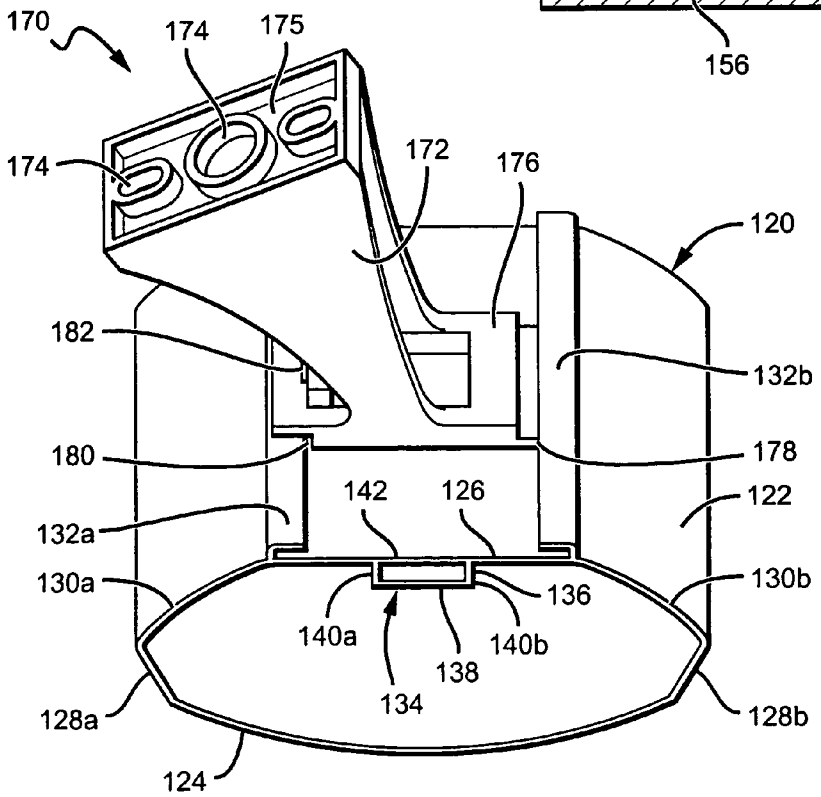
FIG. 21

FIG. 23
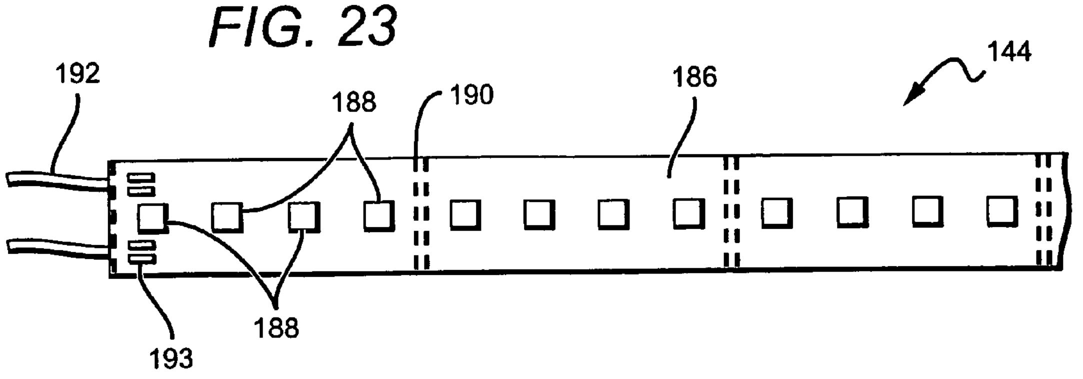
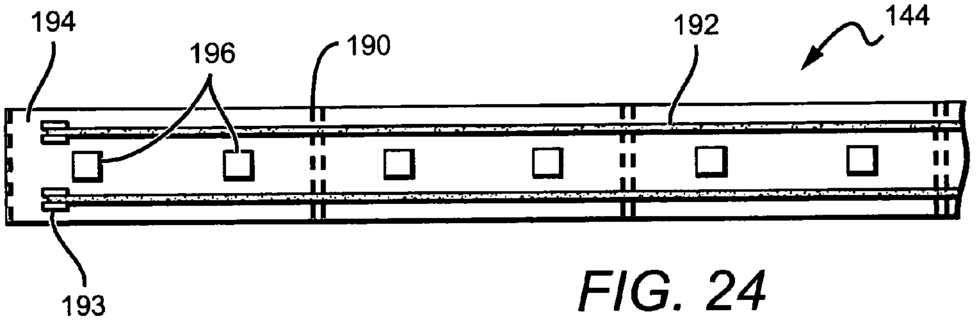
FIG. 24
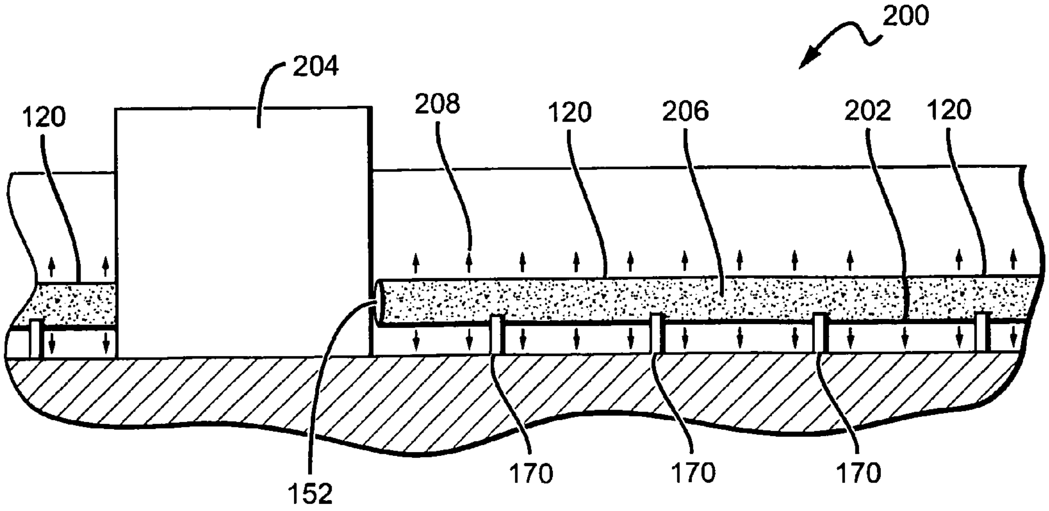
FIG. 25

LOW PROFILE EXTRUSION

This application claims the benefit of provisional application Ser. No. 61/127,039 to Thomas C. Sloan, which was filed on 9 May 2008.

BACKGROUND OF THE INVENTION

1. Field of the Invention

The present invention generally relates to housings for electronic elements and/or devices, and more particularly to low profile extrusions for housing electronic elements and/or devices that emit light.

2. Background

In recent years, there have been dramatic improvements in the number and types of housings for light emitting devices. The frequency with which housings for devices and/or chips mounted onto circuit boards has similarly grown. Improvements in the housings for such devices have helped advance the development of final products incorporating mounted devices and can significantly reduce the cost and complexity of the product.

Commonly, light emitting diodes (LEDs) mounted on circuit boards are the devices used within these improved housings. LEDs are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Developments in LED technology have resulted in devices that are brighter, more efficient and more reliable. LEDs are now being used in many applications that were previously the realm of incandescent fluorescent or neon bulbs; some of these include displays, shelf lighting, refrigeration lighting, petroleum canopy lighting, exterior lighting, cove lighting and any other application where lighting is desirable or may be required. As a result, circuit board mounted LEDs and/or other similar devices can be used in applications in which they are subjected to environmental conditions that can degrade the device and adversely affect its functions and properties.

U.S. Pat. No. 4,439,818 to Scheib discloses a lighting strip that utilizes LEDs as the light source. The strip is flexible in three dimensions and is useful in forming characters and is capable of providing uniform illumination regardless of the characters selected for display. The strip comprises a flexible multi-layered pressure sensitive adhesive tape, having a plurality of triangle cutout sections on each side of the tape, with LEDs connected in a series with a resister. One disadvantage is that this arrangement is not durable enough to withstand the conditions for outdoor use. The flexible tape and its adhesive can easily deteriorate when continually exposed to the elements. Furthermore, this strip cannot be cut to different lengths for different, custom applications.

U.S. Pat. No. 5,559,681 to Duarte discloses a flexible, self adhesive, light emissive material that can be cut into at least two pieces. The light emissive material includes a plurality of light electrically coupled light emissive devices such as light emitting diodes. The material also includes electric conductors for conducting electric power from the source of electric power to each of the light emissive devices. While this lighting arrangement is cuttable to different lengths, it is not durable enough to withstand the conditions for outdoor use. The flexible tape and its adhesive can easily deteriorate.

LEDs have been used in perimeter lighting applications. PCT International Application Number PCT/AU98/00602 discloses perimeter light that uses LEDs as its light source and includes a light tube structure in which multiple LEDs are arranged within an elongated translucent tube that diffuses or disperses the light from the LEDs. The perimeter light is used to highlight or decorate one or more features of a structure, such as a roof edge, window, door or corner between a wall or roof section. This light apparatus, however, cannot be cut to match the length of a building's structural features. Instead, the perimeter lighting must be custom ordered or it is mounted without fully covering the structural feature. In addition, the light's tube significantly attenuates the light emitted by its LEDs, significantly reducing the light's brightness. Further, the light does not include a mechanism for compensating for the expansion and contraction between adjacent lights.

U.S. Pat. No. 5,678,335, to Gomi et al. discloses a display device having a plurality of light sources arranged along a display pattern for display by emitting light from the light sources. Each of the light sources has a light emitting diode (LED) in an open and elongated unit case. The case has a lens that disperses the light from the LEDs, at least in a lengthwise direction. The display pattern comprises a series of open grooves with the light sources attached to the grooves so that the light sources can be illuminated to illuminate the display pattern.

U.S. Pat. No. 6,042,248, to Hannah et al., discloses a LED assembly for illuminating signs having an enclosure covered by a translucent panel. Each sign includes a plurality track molding at the base of its enclosure, with the molding running along the longitudinal axis of the enclosure. Linear arrays of LEDs that are mounted on the printed circuit boards (PCBs), are mounted in the track moldings. Each track molding can hold two PCBs in parallel with each of the PCBs arranged on a longitudinal edge with the LEDs directed outward.

It is desirable to have an apparatus for holding electronic elements and/or devices that emit light which allow for improved light diffusion while increasing the environmental protection of the housed components. Moreover, it is desirable to provide an apparatus for holding electronic elements that is relatively low profile, and can be customized to fit and be mounted on a variety of different structures; as part of this ability to customize, it is desirable to provide a holding apparatus and electronic element(s) that can be cut on location without compromising the function of the underlying holder or electronics. Additionally, it is desirable to provide an environmentally protective holder that is sealed from the elements, with the seals capable of withstanding fluctuations in the holder from heat produced by the electronic elements.

SUMMARY OF THE INVENTION

The present invention provides apparatuses and methods of manufacturing low profile extrusions for housing electronic elements and/or devices that emit light which allow for improved light diffusion while increasing environmental protection of the housed components, increasing the life of the housed device, and decreasing the costs and complexity of manufacturing. One embodiment provides a low profile housing which comprises a casing with a first surface, second surface substantially opposite the first surface, and at least one lateral side surface. The casing is substantially light-diffusive. At least one end cap is provided for sealing an end of the casing, with the at least one end cap sized to account for variations in said casing. One or more electronic devices are mounted within the casing, with the one or more devices abutting at least the first surface of the casing.

Another embodiment provides a low profile extrusion with a hollow, elongated casing comprising a first surface, a second surface substantially opposite said first surface that is substantially free of lines and tooling marks, and at least one lateral side surface. The casing is substantially light-diffusive. End caps are provided for sealing the ends of the casing, with at least one of the end caps comprising a through-hole for receiving a power cable. The through-hole has a diameter smaller than the diameter of the cable. One or more light emitting diodes (LEDs) are mounted within the casing, and a mounting means is provided for mounting said extrusion and securing it in low profile with respect to a mounting surface.

Another embodiment provides a low profile housing with a first elongated hollow casing comprising a top surface and a bottom surface, with the casing being substantially light diffusive. A second elongated and substantially hollow casing is also provided, which surrounds all but the top surface of the first casing. Furthermore, at least one end cap for sealing an end of the first casing is provided, as well as one or more light emitting devices mounted within the first casing.

Another embodiment provides a low profile housing comprising a first elongated hollow casing with a top surface and a bottom surface, a second elongated and substantially hollow casing surrounding all but the top surface of the first casing, one or more double-sided printed circuit boards mounted within the first casing, and a plurality of light emitting diodes on each side of the one or more double-sided circuit boards. Light emitted from an upper side of the circuit boards transmits through the top surface of the first casing, and light emitted from a bottom side of the circuit boards transmits through the bottom surface of the first casing and through the second casing, with the wavelength of light emitting from the top surface differing from the wavelength of light emitting from the second casing.

Another embodiment provides a method for manufacturing a low profile housing, such that a hollow, light-diffusive first casing is extruded comprising a first surface and a second surface substantially opposite the first surface. The first and second surfaces are substantially free from extrusion lines and tooling marks. At least one electronic and/or optoelectronic device is positioned within said first casing. At least one end cap is secured on at least one end of the first casing such that the casing is sealed.

These and other further features and advantages of the invention would be apparent to those skilled in the art from the following detailed description, taken together with the accompanying drawings, in which:

BRIEF DESCRIPTION OF THE DRAWINGS

FIG. 1 is a side plan view of one embodiment of a low profile extrusion according to the present invention, with the opposite side being substantially similar;

FIG. 2 is an overhead view of one embodiment of a mounting clip according to the present invention;

FIG. 3 is a side plan view combining the embodiments shown in FIGS. 1 and 2;

FIG. 4 is a perspective view of one embodiment of a mounting clip according to the present invention;

FIG. 5 is a perspective view of one embodiment of a mounting clip according to the present invention;

FIG. 6 is a perspective view of one embodiment of an end cap according to the present invention;

FIG. 7 is a front side view of the embodiment shown in FIG. 6;

FIG. 8 is an overhead view of the embodiment shown in FIG. 6;

FIG. 9 is a left side view of the embodiment shown in FIG. 6, with the right side being substantially similar;

FIG. 13 is a left side view of the embodiment shown in FIG. 10, with the right side being substantially similar;

FIG. 14 is a left side plan view taken along section line A-A of the embodiment shown in FIGS. 10 and 11, with the opposite side being substantially similar;

FIG. 15 is a perspective view of a plurality of connected light emitting devices using the new low profile extrusion according to the present invention;

FIG. 17 is a side plan view of another embodiment of a low profile extrusion according to the present invention, with the opposite side being substantially similar;

FIG. 18 is an exploded view of one end of an extrusion using the embodiment shown in FIG. 17;

FIG. 19*a* is a perspective view of one embodiment of an end cap with gasket as shown in FIG. 18, with FIG. 19*b* depicting a cross-sectional view of the gasket as taken along section lines A-A of FIG. 19*a;*

FIG. 20*a* is a perspective view of the end cap with gasket of FIG. 19*a*, with FIG. 20*b* depicting a cross-sectional view of the gasket bonded with the end cap as taken along section lines B-B of FIG. 20*a;*

FIG. 21 is a perspective view of one embodiment of a mounting bracket according to the present invention;

FIG. 23 is a top perspective view of a double-sided circuit board with LEDs according to one embodiment of the present invention;

FIG. 24 is a bottom perspective view of the double-sided circuit board depicted in FIG. 23; and FIG. 25 is a perspective view of a structure with mounted, daisy-chained extrusions according to the present invention.

DETAILED DESCRIPTION OF THE INVENTION

Figure 10:
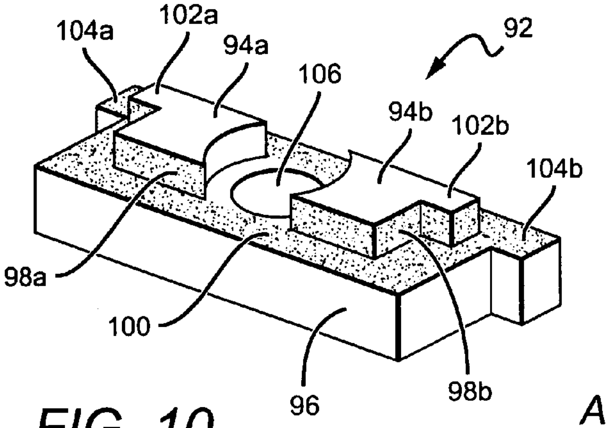
FIG. 10 is a perspective view of one embodiment of an end cap according to the present invention.
Figure 11:
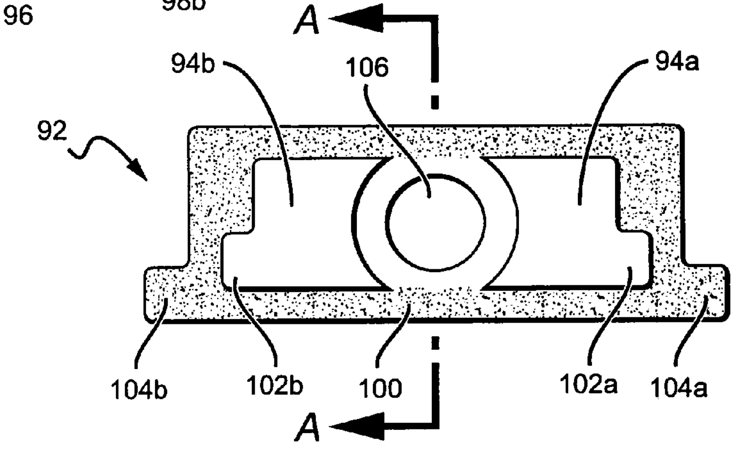
FIG. 11 is a front side view of the embodiment shown in FIG. 10.
Figure 12:
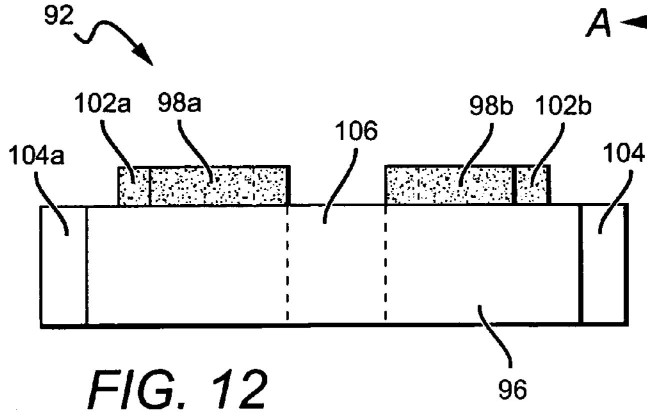
FIG. 12 is an overhead view of the embodiment shown in FIG. 10.
Figure 13:
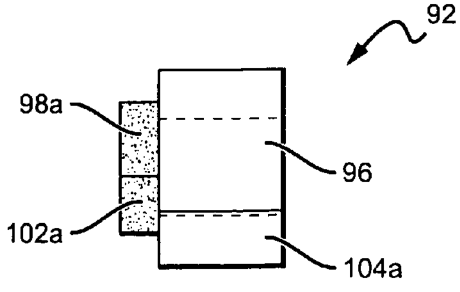
Figure 14:
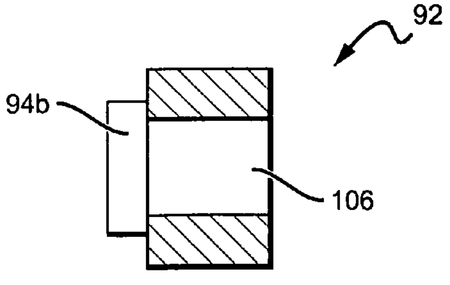

The following description presents preferred embodiments. This description is not to be taken in a limiting sense but is made merely for the purpose of describing the general principles of the invention, the scope of which is further understood by the appended claims.

Housings for electronic elements such as light emitting devices can be provided to eliminate or reduce any adverse environmental impact. However, the properties of housings can actually reduce the effectiveness of the light emitting device by not diffusing the light as desired. Additionally, properties of the housings such as seams or lines from the manufacturing process may unfavorably affect the manner in which emitted light is cast onto a surface being illuminated.

Caps for the housings may also be provided to completely enclose the devices so as to further protect against the environment without interfering with the lighting applications of the device. However, housings may differ slightly from one another as a result of the manufacturing process or they may fluctuate in size due to heat produced from the electronic elements, making caps unable to properly conform to the housing to provide an adequate seal. Additionally, wires into the housing may be required to allow the device to function. However, providing a hole in the housing or cap(s) for the wire to pass-through can reduce the environmental protection afforded by the housing.

The present invention provides apparatuses and methods of manufacturing housings for electronic elements, in particular low profile extrusions used to house light emitting devices. Some embodiments are particularly applicable to house optoelectronic elements used in applications such as petroleum canopy lighting, shelf lighting, refrigeration lighting, cove lighting, exterior accent lighting, displays, magazine racks, and any other location where linear lighting may be required. The optoelectronic elements may include one or more circuit boards with light emitting diodes (LEDs), solar cells, photodiodes, laser diodes, and other such optoelectronic elements or combinations of optoelectronic elements. Preferred embodiments of the present invention are generally directed to housings incorporating LEDs, but it is understood that the other light emitting devices discussed may also be used. Some exemplary embodiments of the housings are designed, at least in part, to effectively diffuse the emitted light and/or protect the light emitting devices from environmental hazards.

The housing is easy to manufacture, low in cost, easy to use and mount, and houses the light emitting device(s) in a precise and aesthetically pleasing manner. It is also substantially low profile such that the height of its body is short in comparison to the width and length of its body. Furthermore, the housing is light-weight, customizable to a variety of different lengths and shapes, and particularly adapted to applications where linear lighting is desired or required. It is understood, however, that the housing can be used for many different applications. Exemplary methods for manufacturing the main body of such housings may include, for example, forming hollow housings using extrusion or double extrusion processes known in the art. However, it is understood that many other manufacturing methods may be used.

The housing can further comprise at least one end cap to protect the housed components and allow passage of a cable into the housing. The housing generally consists of a hollow center with an inner surface for holding light emitting devices, or a substantially hollow center with an additional hollow extrusion in its interior for holding light emitting devices. The inner surface or additional hollow extrusion is particularly adapted for holding printed circuit boards with LEDs, but it understood that many other electronic devices and/or optoelectronic devices may be incorporated in the housing.

The present invention is described herein with reference to certain embodiments but it is understood that the invention can be embodied in many different forms and should not be construed as limited to the embodiments set forth herein. In particular, the present invention is described below in regards to housing printed circuit boards with LEDs in a low profile extrusion with an end cap on either side, but it is understood that the present invention can be used for housing many different devices in different ways.

It is also understood that when an element or feature is referred to as being "on" another element or feature, it can be directly on the other element or feature or intervening elements may also be present. Furthermore, relative terms such as "inner", "outer", "upper", "above", "lower", "beneath", and "below", and similar terms, may be used herein to describe a relationship of one element or feature to another. It is understood that these terms are intended to encompass different orientations of the housing and its components and contents in addition to the orientation depicted in the figures.

Although the terms first, second, etc. may be used herein to describe various elements, components, features and/or sections, they should not be limited by these terms. These terms are only used to distinguish one element, component, feature or section from another. Thus, a first element, component, feature or section discussed below could be termed a second element, component, feature or section without departing from the teachings of the present invention.

Embodiments of the invention are described herein with reference to illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A feature illustrated or described as square or rectangular can have rounded or curved features due to normal manufacturing tolerances. Thus, the features illustrated in the figures are not intended to illustrate the precise shape of a feature and are not intended to limit the scope of the invention.

FIG. 1 shows a side plan view of one embodiment of a low profile extrusion 10 according to the present invention that can be used to house one or more light emitting devices, such as a printed circuit board with LEDs or a double-sided printed circuit board with LEDs. The low profile extrusion 10 comprises an elongated casing 12, with the casing comprising a device-supporting bottom surface 14, a top surface 16, first side surfaces 18*a*-18*b*, second side surfaces 20*a*-20*b*, and external flanges 22*a*-22*b*.

As depicted in FIG. 1, the casing in some embodiments can have a generally rectangular shape, with bottom surface 14 opposite top surface 16. However, the width 24 between first side surfaces 18*a*, 18*b* is greater than the width 26 between second side surfaces 20*a*, 20*b*. This creates heights 28*a*-28*b*, which are shorter than height 30 between bottom surface 14 and top surface 16. When a light emitting device such as a printed circuit board with LEDs is mounted within low profile extrusion 10, bottom surface 14 is positioned adjacent to the circuit board, with the circuit board at least partially held in place on either side in the gaps created by heights 28*a*, 28*b* such that the light emitted from the LEDs emits away from bottom surface 14. Alternatively, when a light emitting device such as a double-sided printed circuit board (with LEDs on two sides) is positioned in the extrusion and held in place as described above, light emitted from the double-sided printed circuit board can emit both away from bottom surface and through bottom surface 14. Double-sided printed circuit boards are discussed in more detail below. The low profile extrusion 10 can be configured in numerous other relevant shapes without departing from the novel aspects of the invention.

Although the circuit board can be held in place between the gaps created by heights 28*a*, 28*b*, the bottom surface 14 can provide a surface upon which one or more electronic and/or optoelectronic devices such as a printed circuit board(s) with LED(s) can be further secured. Such a device(s) can also be mounted and/or secured on bottom surface 14 via soldering, bonding, and/or any other relevant mounting method or combinations of methods.

The casing 12 is preferably made from a substantially clear material with light diffusive properties such as acrylic, although it is understood that materials with similar properties may be used as well. Light diffusants such as scattering particles (e.g. Titanium oxides) or calcium carbonate may be added to the casing 12 material during the extrusion process to help address tooling marks and lines from the extrusion process and aid in the diffusive properties of the casing 12. To further maximize the diffusive properties of the casing 12, the surface finish should be as smooth as possible and the hatched area within top surface 16 must be substantially free of tooling marks and lines from the extrusion process on both its internal and external surfaces. If a double-sided printed circuit board is used, then most of bottom surface 14 must also be substantially free of tooling marks and lines from the extrusion process in order to maximize diffusive properties of the casing. The diffusive properties of the casing allow the light sources on the circuit board to appear as one, continuous light source when they emit light.

As a result of the low profile shape of the casing 12, the external ends preferably comprise a surface area that is minimized when compared to the surface area along the length of the casing 12. This allows the ends to be sealed more easily and efficiently than a housing with a comparatively larger surface area on its sealing portion, while reducing the possibility that any external environmental conditions can infiltrate the housing.

The dimensions of low profile extrusion 10 can depend on the one or more anticipated electronic and/or optoelectronic devices to be housed within, the expected implementation of the extrusion 10 and its components, the amount of light to be dissipated by the device, and/or other such factors. For example, according to one embodiment, the approximate dimensions of the extrusion 10 can include a height from the bottom of surface 14 to the top of surface 16 of 0.300 inches, a thickness of surface 16 of 0.050 inches, a width 26 measuring 0.550 inches, a width of hatched section measuring 0.50 inches, a width 24 of 0.650 inches, heights 28*a*, 28*b* of 0.080 inches, a height 30 of 0.200 inches, a width between the external-most portions of flanges 22*a*, 22*b* of 0.890 inches, a height of flanges 22*a*, 22*b* of 0.030 inches, and a height from the bottom of surface 14 to the top of flanges 22*a*, 22*b* of 0.080 inches +/−0.015 inches. Extrusion may be cut to any variety of lengths depending on the intended use.

FIGS. 2-5 depict various embodiments of a mounting clip for mounting the low profile extrusion 10 shown in FIG. 1. While FIGS. 2-5 depict some exemplary methods for clips used to mount extrusion 10, it is understood that any number of mounting methods may be used, including for example, track systems, double-sided tape, surface bonding, or simple placement on a supporting surface.

FIG. 2 shows an overhead view of mounting clip 32 according to one embodiment of the present invention. FIG. 3 is a side plan view of low profile extrusion 10 supported within mounting clip 32. Mounting clip 32 comprises a substantially flat surface 40 from which protrusions 36*a*, 36*b* extend in a substantially perpendicular fashion. Lips 34*a*, 34*b* extend perpendicularly from protrusions 36*a*, 36*b* and are substantially parallel to flat surface 40. Hole 38 passes through second surface 42, which is an extension of flat surface 40 that extends to the right of protrusion 36*b*.

An external side of surface 42 may abut an external mounting surface (not shown) such that surface 40 may extend beyond the external mounting surface. Alternatively, portions of both surfaces 40 and 42 may abut an external mounting surface such that protrusions 36*a*, 36*b* extend away from the external mounting surface, although it is understand that there are any number of arrangements that can occur with respect to an external mounting surface. A screw, nail, post or the like may be passed through hole 38 to connect mounting clip 32 to an external surface.

Protrusions 36*a*, 36*b* are adjacent to the outermost surface of flanges 22*a* 22*b*, while lips 34*a*, 34*b* extend over the top of flanges 22*a*, 22*b* to hold the extrusion 10 in place. It is understood that mounting clip 32 can be made from a variety of materials, such as plastic, acrylic, metal, or any other suitable materials. Depending on the characteristics of the material of mounting clip 32, extrusion 10 can either be snapped into place between protrusions 36*a*, 36*b* and lips 34*a*, 34*b* or slid into place along flat surface 40 and between protrusions 36*a*, 36*b* and lips 34*a*, 34*b*. For example, if mounting clip 32 is made from a flexible plastic or metal, flanges 22*a*, 22*b* can be pressed against lips 34*a*, 34*b* causing protrusions 36*a*, 36*b* to extend outward such that extrusion 10 can be pushed into place. The flexible nature of the material will cause protrusions 36*a*, 36*b* and lips 34*a*, 34*b* to return to their original position and secure the protrusion 10. Alternatively, protrusion 10 can be slid into place regardless of the characteristics of the material of mounting clip 32.

FIG. 4 shows a perspective view of another embodiment of a mounting clip according to the present invention. Mounting clip 44 comprises a substantially flat surface 48 from which lower lip 52 and raised surface 54 extend. Upper curved arm 46 extends away from surface 54 and toward lower lip 52, with upper lip 50 extending down from the outside end of arm 46. Nut 56 sits adjacent to arm 46 on surface 54. Hole 58 passes through nut 56 and surface 54.

An external side of surface 54 may abut an external mounting surface (not shown) such that surface 48 may extend beyond the external mounting surface. Alternatively, portions of both surfaces 48 and 54 may abut an external mounting surface such that arm 46 extends away from the external mounting surface, although it is understood that there are any number of arrangements that can occur with respect to an external mounting surface. Nut 56 can include threading along the circumference of hole 58 such that a screw with corresponding threading (not shown) can be turned into hole 58 and nut 56 can be tightened to secure clip 44 to an external mounting surface. However, nut 56 is not required and it is understand that a nail, post or the like may be passed through hole 58 to connect mounting clip 44 to an external surface.

Arm 46, surface 48, and lips 50, 52 act together to surround extrusion 10 and hold it in place. It is understood that mounting clip 44 can be made from a variety of materials, such as plastic, acrylic, metal, or any other suitable materials. If the material has flexible characteristics, extrusion 10 can be clipped into place between arm 46, surface 48 and lips 50, 52. Alternatively, extrusion 10 can be slid into place in between arm 36, surface 48 and lips 50, 52.

FIG. 5 is a perspective view of one embodiment of a mounting clip according to the present invention, which is a variation of the clip 32 depicted in FIGS. 2 and 3. Mounting clip 60 comprises a substantially flat surface 62 from which protrusions 64, 66 extend in a substantially perpendicular fashion. Lips 68, 70 extend perpendicularly from protrusions 64, 66 and are substantially parallel to flat surface 62. Nut 74 sits on second surface 72, which is an extension of flat surface 62 that extends to the left of protrusion 64. Hole 76 passes through nut 74 and surface 72.

An external side of surface 72 may abut an external mounting surface (not shown) such that surface 62 may extend beyond the external mounting surface. Alternatively, portions of both surfaces 62 and 72 may abut an external mounting surface such that protrusions 64, 66 extend away from the external mounting surface, although it is understand that there are any number of arrangements that can occur with respect to an external mounting surface. Nut 74 can include threading along the circumference of hole 76 such that a screw with corresponding threading (not shown) can be turned into hole 76 and nut 74 can be tightened to secure clip 60 to an external mounting surface. However, nut 74 is not required and it is understand that a nail, post or the like may be passed through hole 76 to connect mounting clip 60 to an external surface.

Protrusions 64, 66 are adjacent to the outermost surface of flanges 22*a* 22*b*, while lips 68, 70 extend over the top of flanges 22*a*, 22*b* to hold the extrusion 10 in place. It is understood that mounting clip 60 can be made from a variety of materials, such as plastic, acrylic, metal, or any other suitable materials. Depending on the characteristics of the material of mounting clip 60, extrusion 10 can either be snapped into place between protrusions 64, 66 and lips 68, 70 or slid into place along flat surface 62 and between protrusions 64, 66 and lips 68, 70.

The dimensions of a mounting clip according to the present invention can depend on the dimensions of extrusion 10, the type of mounting clip being used, and/or other such factors. For example, according to one embodiment with characteristics similar to mounting clip 32, the approximate dimensions are as follows: a width of surfaces 40, 42 of 0.500 inches, a diameter of hole 38 of 0.160 inches, a length of surface 40 of 1.000 inches, a length of surface 42 of 0.375 inches, a height of protrusions 36*a*, 36*b* of 0.240 inches, a height of surfaces 40, 42 of 0.060 inches, and a width of lips 34*a*, 34*b* of 0.105 inches.

FIGS. 6-9 depict an end cap 78 according to some embodiments. End cap 78 is designed to seal at least one end of extrusion 10 in order to protect the housed device against environmental conditions such as moisture. End caps according to the present invention are constructed, at least in part, of a substantially soft and flexible material that can withstand thermal emissions from the housed device and variations in the extrusion that result from the manufacturing process. The end cap is also preferably formed of a material that is resistant to water and other environment conditions that could otherwise infiltrate the housing. A suitable material is silicone, but it is understood that other relevant materials may be used.

End cap 78 includes an internal cap section 80, external cap section 82, first bonding surface 84 (shown by hatched lines), second bonding surface 86 (shown via shading), internal flanges 88*a*, 88*b*, and external flanges 90*a*, 90*b*. Internal cap section 80 is designed to fit inside at least one end of extrusion 10, with first bonding surface 84 coupled with internal flanges 88*a*, 88*b* sized to fit closely within an internal portion of at least one end of extrusion 10 and the gaps caused by heights 28*a*, 28*b* respectively. External cap section 82 is designed to fit external to at least one end of extrusion 10, with external flanges 90*a*, 90*b* shaped and sized to generally correspond to flanges 22*a*, 22*b*. External cap section 82 is further preferably sized so as to be slightly larger than the external portion of at least one end of extrusion 10, such that bonding surface 86 can compensate for any changes in the extrusion 10 caused by manufacturing variations and or thermal expansion. While end cap 78 is depicted as having a generally rectangular shape with flanges to conform with a generally rectangular end with flanges of extrusion 10, it is understood that the end cap 78 may be configured in any number of relevant shapes, such as a square, rectangular, or oval.

When the end cap 78 is placed on at least one end of the extrusion 10, first bonding surface 84 is fitted closely to the inside of an extrusion end and bonded using an adhesive along surface 84 and the corresponding internal end portion of extrusion 10. While any number of adhesives can be used, a preferred adhesive will be thermally resistive and seal the extrusion from environmental conditions such as moisture. Similarly, second bonding surface 86 is bonded to the external surface of at least one end of extrusion 10 using an appropriate adhesive.

FIGS. 10-14 depict an alternative end cap 92 according to some embodiments. End cap 92 is designed to seal at least one end of extrusion 10 in order to protect the housed device against environmental conditions such as moisture. End cap 92 is constructed of the same material as end cap 78.

End cap 92 includes internal cap sections 94*a*, 94*b*, external cap section 96, first bonding surfaces 98*a*, 98*b* (depicted by hatched lines), second bonding surface 100 (shown via shading), internal flanges 102*a*, 102*b*, external flanges 104*a*, 104*b*, and through-hole 106. Internal cap sections 94*a*, 94*b* are designed to fit inside at least one end of extrusion 10, with first bonding surfaces 98*a*, 98*b* coupled with internal flanges 102*a*, 102*b* sized to fit closely within an internal portion of at least one end of extrusion 10 and the gaps caused by heights 28*a*, 28*b* respectively. External cap section is designed to fit external to at least one end of extrusion 10, with external flanges 104*a*, 104*b* shaped and sized to generally correspond to flanges 22*a*, 22*b*. External cap section 96 is further preferably sized to be slightly larger than the external portion of at least one end of extrusion 10, such that bonding surface 100 can compensate for any changes in the extrusion 10 caused by manufacturing variations and or thermal expansion.

Hole 106 is provided in the middle of end cap 92 such that a cable (not shown) may be passed through to provide power to the housed device. The diameter of hole 106 is smaller than the diameter of the cable such that a seal is created around the cable to prevent environmental conditions from infiltrating the interior of extrusion 10. While end cap 92 is depicted as having a generally rectangular shape with flanges to conform with a generally rectangular end with flanges of extrusion 10, it is understood that the end cap 92 may be configured in any number of relevant shapes, such as a square, rectangular, or oval.

When the end cap 92 is placed on at least one end of the extrusion 10, first bonding surfaces 98*a*, 98*b* are fitted closely to the inside of an extrusion end and bonded using an adhesive as described above. Similarly, second bonding surface 100 is bonded to the external surface of at least one end of extrusion 10 using an appropriate adhesive.

The dimensions of an end cap(s) according to the present invention can vary depending on the dimensions of the extrusion/housing, whether a cable is to be passed through, and/or other relevant factors. For example, in some embodiments of an end cap as shown in FIGS. 7-10, the dimensions can be as follows: a height of section 82 of 0.320 inches, a height of external flanges 90*a*, 90*b* of 0.100 inches, a width of the top portion of section 82 of 0.770 inches, a width from the external edge of flange 90*a* to the external edge of flange 90*b* of 0.910 inches, a width of the top portion of section 80 of 0.530 inches, a width from the external edge of flange 88*a* to the external edge of flange 88*b* of 0.630 inches, a thickness of section 82 of 0.188 inches, and a thickness of section 80 of 0.063 inches. An end cap according to the alternative embodiment of FIGS. 11-14 may have similar dimensions to the end cap as described above, but with the through-hole 106 having a diameter of 0.156 inches that is slightly smaller than the diameter of a cable running through said hole.

FIG. 15 depicts a plurality of connected light emitting devices 110 with three low profile extrusions 10 in a daisy-chain. While there are three extrusions 10 connected in this application, it is understood that any number of extrusions may be connected in numerous configurations. End caps 92 are provided on the ends of extrusions 10 to allow wire(s) 112 to pass through and/or between extrusions 10 and end caps 92. A power device (not shown) is connected to wire 112 to provide power to the connected devices 110. It is understood that end caps 92 can be provided wherever a wire into and out of an extrusion is desired. End cap 78 is provided on the end of extrusion 10 on the far right since said extrusion is at the end of the daisy-chain. It is understood that end cap 78 can be provided on any end where a wire 112 is not desired.

Figure 16:
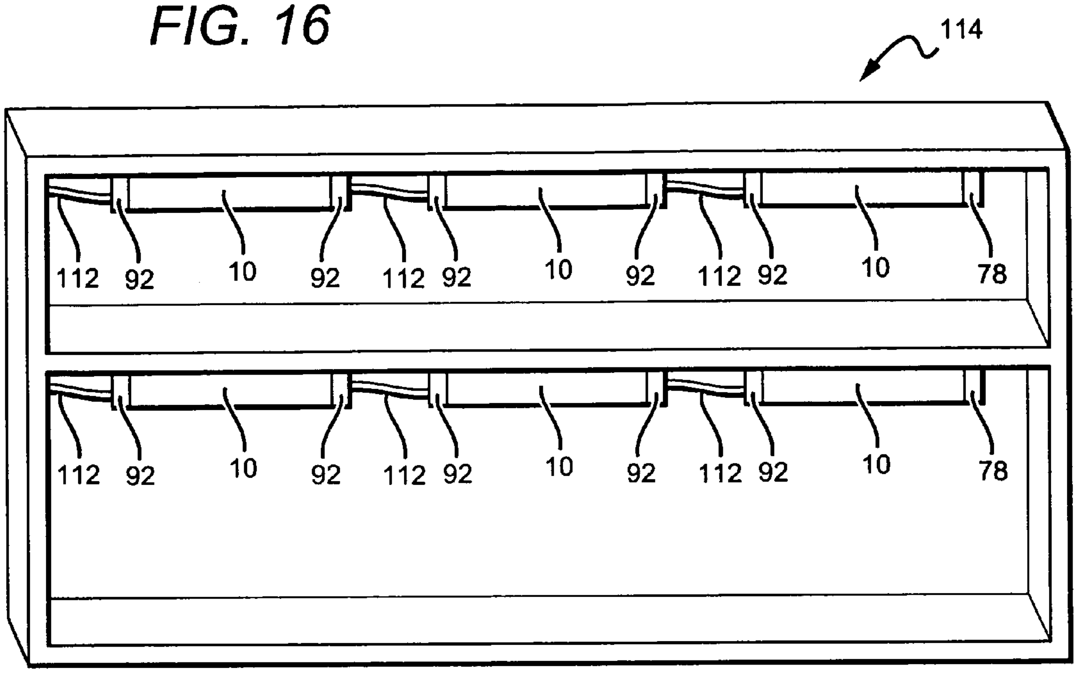
FIG. 16 is a perspective view of a shelving unit using the embodiment shown in FIG. 15.

FIG. 16 depicts a shelving unit 114 utilizing two of the connected devices 110 shown in FIG. 15. The devices 110 are mounted and held in low profile on the surfaces over the two shelves in unit 114 such that the devices 110 are as flush to their mounting surfaces as possible so as to take up as little space as possible. The devices 110 are mounted and secured using any of the mounting means (not shown) as described above. The devices 110 are positioned such that light will diffuse out and down upon any object placed on the shelves.

Figure 17:
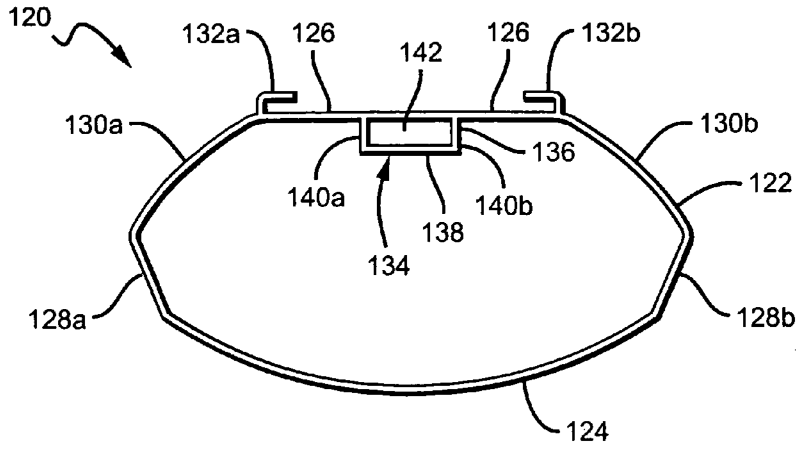

FIG. 17 shows an end view of another embodiment of a low profile extrusion 120 according to the present invention that can be used to house one or more light emitting devices, such as a printed circuit board with LEDs or a double-sided printed circuit board with LEDs on both sides. The low profile extrusion 120 comprises an elongated casing 122, with the casing comprising a rounded bottom surface 124, a top surface 126, angled side surfaces **128*a*-128*b*, second side surfaces 130*a*-130*b*, and external curved extensions 132*a*-132*b*. Additionally, extrusion 120 comprises an integral second extrusion 134 interior to top surface 126, with second extrusion 134 comprising an elongated casing 136, with the casing comprising a bottom surface 138, side surfaces 140*a*-140*b*, and a top surface 142 through top surface 126**.

Second extrusion 134 can be co-extruded with extrusion 120, using double extrusion methods well known in the art. Alternatively, extrusion 120 and second extrusion 134 can be extruded separately, and fitted together in a later manufacturing step. In one embodiment, second extrusion 134 is provided to house a printed circuit board with LEDs, while extrusion 120 is provided to surround second extrusion 134 and aid in, for example, enhancement of the light emitted from the LEDs.

As depicted in FIG. 17, the casing 136 of second extrusion 134 can have a generally rectangular shape, with bottom surface 138 opposite top surface 142 and side surface **140*a* opposite side surface 140*b*. However, it is understood the extrusion 134 can be configured in numerous other relevant shapes without departing from the novel aspects of the invention. When a light emitting device such as a double-sided printed circuit board with LEDs is mounted within extrusion 134, the circuit board is at least partially held in place via a close fit between side surfaces 142*a*-142*b*. Additionally, side surfaces 142*a*-142*b* may be arranged at a slight angle, such that the distance between them narrows toward top surface 142 (or vice versa). This narrowing is another way to create a tight fit between the inside of extrusion 134 and a printed circuit board, which can also work to hold the circuit board in place. Although a circuit board can be held in place between side surface 140*a*-140*b* as described above, it can also be mounted and/or secured in extrusion 134** via soldering, bonding, and/or any other relevant mounting method or combinations of methods.

When a light emitting device such as a double-sided printed circuit board is positioned in the extrusion and held in place as described above, light emitted from the double-sided printed circuit board can emit both through bottom surface 138 and through top surface 142. Alternatively, if a single-sided printed circuit board is positioned in the extrusion, it can be configured to emit light through either bottom surface 138 or top surface 142. Moreover, two single-sided printed circuit boards can be used and configured back-to-back such that light is emitted through both bottom surface 138 and top surface 142.

The casing 136 of extrusion 134 is preferably made from a substantially clear material with light diffusive properties such as acrylic, although it is understood that other materials with similar properties may be used as well. Additionally, it is understood that casing 136 may be comprised of materials of varying colors, although the use of a non-clear material will absorb more emitted light than a clear material. Light diffusants such as scattering particles (e.g. Titanium oxides) or calcium carbonate may be added to the casing 136 material during the extrusion process to help address tooling marks and lines from the extrusion process and aid in the diffusive properties of the casing 136. To further maximize the diffusive properties of the casing 136, the surface finish should be as smooth as possible and as free of tooling marks and lines from the extrusion process on both its internal and external surfaces. The diffusive properties of the casing allow the light sources on the circuit board to appear as one, continuous light source when they emit light.

The casing 122 of extrusion 120 is preferably made from a colored material such as a light permeable plastic, with the plastic capable of further diffusing the light emitted through the bottom surface 138 of second extrusion 134. However, it is understood that other materials with similar properties may also be used in accordance with the present invention. Moreover, the shape of casing 122 can provide desired light diffusing effects, with the shape customizable to provide a variety of desired light diffusing effects. For example, in one possible embodiment, casing 122 may be shaped as shown in FIG. 17 and comprised of a red, light permeable plastic. Light emitted from the bottom surface 138 of extrusion 134 will be diffused by the red plastic, such that casing 122 will give off a substantially red cast. In embodiments wherein a double-sided printed circuit board is fitted in second extrusion 134, light emitted from the other side of the circuit board will be diffused through the top surface 142 of second extrusion 134, such that the top surface 142 will give off white light or whatever color light is emitted from the LEDs if second extrusion is comprised of a substantially clear or frosted material. It is understood that any color may be used for casing 122, and that the LEDs of a single- or double-sided printed circuit board may emit any color or combination of colors to give off a desired effect.

The dimensions and shape of extrusions 120, 134 can depend on the anticipated electronic and/or optoelectronic devices to be housed within second extrusion 134, the expected implementation of the extrusion 120 and its components, the amount of light to be dissipated by the device, and/or other such factors. Extrusions 120, 134 may be cut to any variety of lengths depending on the intended use. Additionally, multiple extrusions 120 may be daisy-chained together as discussed in more detail below.

FIG. 18 is an exploded view of one end of the extrusion 120. As shown, a double-sided printed circuit board 144 is slid into second extrusion 134, where it will maintain a tight fit within extrusion 134 via close measurements or other means of securing it into place as discussed above. The side of circuit board 144 facing upward will have a plurality of light emitting devices (not shown) that will emit light through the top surface 142 of second extrusion 134. As seen in FIG. 18, top surface 142 is more clearly differentiated from the top surface 126 of casing 122. Top surface 142 is preferably either clear or frosted, and comprised of a material that substantially diffuses the light from the light emitting devices such that they appear as one continuous light source. Moreover, the light emitted from the light emitting devices on the top surface of circuit board 144 will preferably be transmitted through top surface 142 such that the same wavelength emitted from the light emitting devices will be emitted from surface 142. For example, if the light emitting devices on the top surface of circuit board 144 emit yellow light, then the clear or frosted nature of top surface 142 will allow yellow light to be transmitted from it. However, it is understood that any other color or combination of colors may be transmitted through said top surface 142.

The light emitted from the light emitting devices on the lower surface of circuit board 144 will be transmitted through clear or frosted bottom surface 138 of second extrusion 134 such that substantially the same wavelength emitted from the light emitting devices will be transmitted through surface 138. However, once the light reaches and passes through the surfaces of casing 122, the color of the light emitted from casing 122 will depend on whatever color the casing 122 is. For example, if casing 122 is a transparent red and the light emitting devices on the lower surface of circuit board 144 emit white or red light, then the light emitted from casing 122 will be substantially red. However, it is understood that any other color or combination of colors may be transmitted out of casing 122.

Once circuit board 144 is fitted into second extrusion 134, an end cap 146 may be fitted into the end of extrusion 134 to seal the end and protect the electronic elements from environmental elements. The end cap 146 may be substantially similar to the embodiments discussed with respect to low profile extrusion 10, or may comprise a simpler rectangular shape as shown in FIG. 18 such that end cap 146 acts like a simple plug to seal the end of extrusion 134. End cap 146 is sized to fit snugly within extrusion 134, and is preferably formed of silicone. However, it is understood that other suitable materials may also be used. End cap 146 may also comprise a hole 148, provided so a wire 150 used to power electronic elements of circuit board 144 may pass out of extrusion 134 once it is sealed by end cap 146.

Once second extrusion 134 is sealed by end cap 146, extrusion 120 may be sealed using end cap 152. As shown in FIGS. 18, 19*a*-19*b*, and 20*a*-20*b*, end cap 152 is substantially the same shape as the end of extrusion 120. End cap 152 is preferably made of the same material and color as extrusion 120, with plastic or other suitable materials applicable in accordance with the present invention. On the side of end cap 152 facing away from extrusion 120, a locking fin 154 and a groove 155 below fin 154 are provided. When adjacent extrusions 120 are abutted next to one another, the locking fin of one end cap 152 fits into the groove 155 of an adjacent end cap 152. The locking fin 154 and groove 155 arrangement is important, because it allows for movement between adjacent extrusions 120 which may occur for a variety of reasons, such as expansion and/or contractions of the extrusions 120 from temperature variances. These variances can be caused by the heating and cooling from electronics elements mounted within extrusions 120 or can be the result of environmental temperature changes.

On the side of end cap 152 facing toward extrusion 120, a generally perpendicular flange 156 with a central groove is provided. Surrounding flange 156 is an interior surface 158 of end cap 152, which rests against the edge of extrusion 120. A gasket 160 is also provided, which is adapted to fit snugly between flange 156 and the edge of extrusion 120. Gasket 160 is preferably made of silicone, although it is understood that other suitable materials may also be used. As shown in FIGS. 19*a* and 19*b*, flange 161 on gasket 160 is designed to fit into grooved flange 156. An adhesive is preferably applied to surfaces 166 (see FIG. 19*b*), and then even pressure is applied to gasket 160 to enable it to fit snugly in grooved flange 156 via a perpendicular force. FIGS. 20*a* and 20*b* show gasket 160 firmly attached to end cap 152 via grooved flange 156. Once the gasket 160 and end cap 152 are securely attached, end cap 152 can be placed on the end of extrusion 120, with the gasket providing a seal on the extrusion 120 against water and other environmental elements that could harm the electronics within the extrusion. Additionally, the end cap 152 and integrated gasket 160 may also help compensate for variances in the extrusion 120 from the extrusion process. An adhesive may also be applied along surface 158 to provide an additional seal between the inside of end cap 152 and the end of extrusion 120. An adhesive such as Weld-On® may be advantageously used to provide a substantially fused seal, but it is understood that other adhesives are also suitable according to the present invention.

End cap 152 further comprises a rectangular cutout portion of grooved flange 156 as well as rectangular surface 162 with hole 164, with the rectangular cutout and surface 162 designed to fit the end of and around second extrusion 134. Hole 164 is provided to accept wire 150, which is passed through end cap hole 148 and then into hole 164. While end cap 152 and gasket 160 provide one embodiment of a means for sealing the end of extrusion 120, it is understood that other suitable end caps, gaskets, plugs, or other suitable sealing methods may also be used in accordance with the present invention.

Figure 22A:
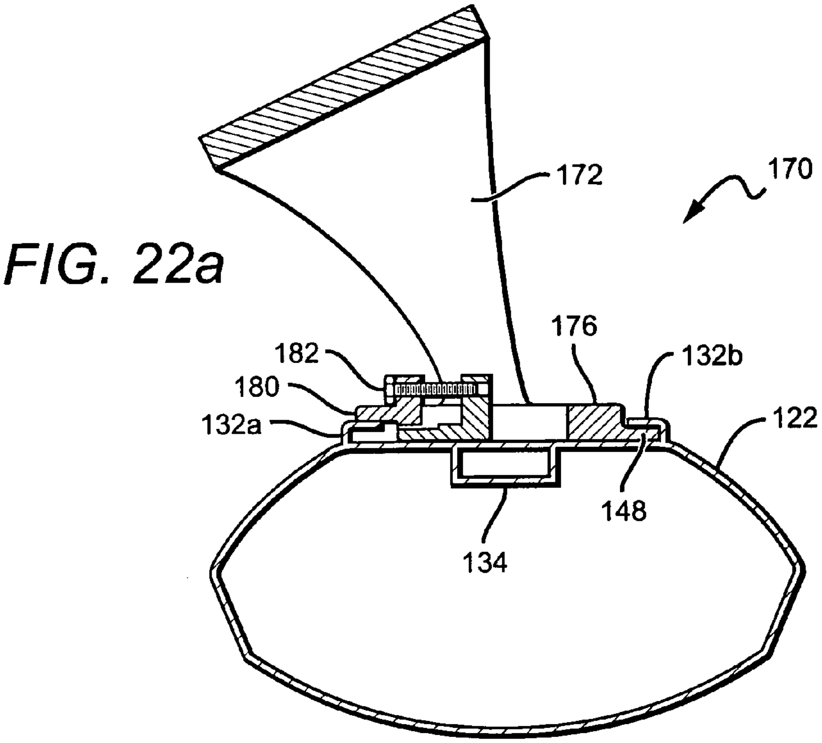
FIG. 22*a* is a cross-sectional view of an un-tightened mounting bracket according to the present invention, with FIG. 22*b* depicting a cross-sectional view of the mounting bracket of 22*a* after being tightened and secured.
Figure 22B:
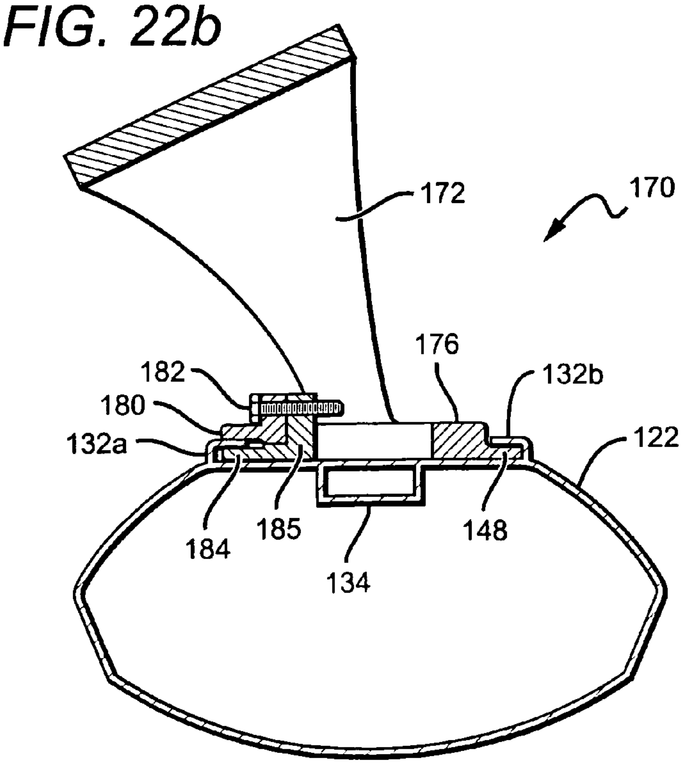

FIGS. 21, 22*a*, and 22*b* depict an embodiment of a mounting bracket for mounting the extrusion 120 shown in FIG. 17. While FIGS. 21, 22*a*, and 22*b* depict one exemplary method for a bracket used to mount extrusion 120, it is understood that any number of mounting methods may be used, including for example, track systems, double-sided tape, surface bonding, or simple placement on a supporting surface.

FIG. 21 shows an overhead perspective view of mounting bracket 170 according to one embodiment of the present invention. Mounting bracket 170 comprises an angled and slightly curved trunk portion 172 protruding from base portion 176. Base portion 176 further comprises a flange 178, designed to slide in and under external curved extension 132*b*. Base portion 176 further comprises a flange 180, with a lower extending portion 184 designed to slide under external curved extension 132*a* when screw 182 is tightened. As best shown in FIG. 22*a*, the mounting bracket 170 is positioned between external curved extensions 132*a* and 132*b*, with flange 178 sliding under extension 132*b*, and flange 180 resting on top of extension 132*a* before screw 182 secures mounting bracket 170 onto extrusion 120. As shown in FIG. 22*b*, screw 182 can be tightened, which causes substantially L-shaped portion 185 to move toward external curved extension 132*a*, such that flange 184 is caused to slide under extension 132*a* and secure mounting bracket 170 to extrusion 120. Alternatively, mounting bracket 170 can be pre-configured such that flange 184 is extended, and then the bracket 170 can be slid into place between extensions 132*a*, 132*b* from one end of extrusion 120.

Mounting bracket 170 further comprises mounting holes 174 along the surface 175 on the opposite of trunk 172 from base portion 176. The mounting holes 174 are provided so mounting bracket 170 may be secured to an external surface, such as a building, that is intended to be illuminated by extrusion 120. Screws, nails, posts or the like may be passed through holes 174 to connect mounting brackets 170 to a desired external surface. Mounting bracket 170 can be made from a variety of materials, such as plastic, acrylic, metal, or any other suitable materials.

The dimensions of mounting bracket 170 can depend on the dimensions of extrusion 120, the type of surface extrusion 120 is to be mounted on, the desired lighting effects to be provided by extrusion 120, and/or other such factors. For example, according to one embodiment of the present invention, the trunk 172 of mounting bracket 170 can be approximately 6 inches in length, which allows for the extrusion 120 to stick out from an external surface such that light emitting from the top surface of extrusion 134 can essentially act as a backlight when extrusion 120 is mounted. However, it is understood that other dimensions for mounting bracket 170 are also acceptable according to the present invention.

FIGS. 23 and 24 depict a double-sided circuit board 144 with light emitting devices on both sides according to one embodiment of the present invention. FIG. 23 depicts the top surface 186 of circuit board 144, which preferably comprises a plurality of LEDs 188 along its length. However, it is understood that other suitable light emitting devices may also be used in accordance with the present invention. LEDs 188 may be incorporated to emit any color or combination of colors according to desired emission effects. For example, in one embodiment according to the present invention, LEDs 188 may be adapted to emit yellow light. The top surface 186 of circuit board 144 is the side that faces toward the top surface 142 of second extrusion 134 (or alternatively the top surface 16 of extrusion 10). If extrusion 134 (or extrusion 10) is comprised of a clear or frosted material, the light emitted from the top surface will appear substantially yellow. Alternatively, if other colors or color combinations are emitted from LEDs 188, the color emitted from a clear or frosted top surface of extrusions 10 or 134 will be substantially the same as that emitted from LEDs 188.

Black lines 190 on both the top and bottom surfaces of double-sided circuit board 144 represent the locations where circuit board 144 is cuttable along its length without cutting underlying drive circuitry. As such, the length of circuit board 144 can be readily customized on-site to conform to any desired length as required by the external surface the extrusion 10 or 120 is to be mounted on. Moreover, circuit board 144 can be readily cut when it is installed within extrusion 10 or second extrusion 134, so long as extrusions 10, 134 are comprised of a substantially transparent material such that black lines 190 are visible through them. In this way, the extrusions 10, 134 and circuit board 144 can be simultaneously cut on-site, which can reduce the steps necessary to provide a customized end-product. Any device or tool may be used to cut the circuit board 144 along black lines 190 and the corresponding extrusion, including knives, saws, scissors, lasers, etc. Alternatively, the cuttable circuit board 144 may be separated from an adjacent portion via snapping, flexing, bending, or other similar motion.

One important aspect of cuttable circuit board 144 is that the electronic elements of the separated portions remaining after a cut are fully functional without the need for any complicated rewiring. To enable such fully functional cut portions, underlying cuttable circuits must be provided in circuit board 144. Suitable embodiments of cuttable circuits are described in U.S. patent application Ser. No. 12/321,422 to the same inventors and assignee of the present invention, which is incorporated herein by reference. It is understood that either single- or double-sided cuttable circuit boards may be provided in accordance with the present invention. Moreover, the circuit boards may be segmented at various portions along their length such that they the segments may essentially be folded over one another; this segmenting allows the circuit boards, which could otherwise be quite substantial in length, to be folded and compressed for shipping.

FIG. 24 depicts the bottom surface 194 of circuit board 144, which preferably comprises a plurality of LEDs 196 along its length, although other suitable light emitting devices may also be used. LEDs 196 may be incorporated to emit any color or combination of colors according to desired emission effects. For example, in one embodiment according to the present invention, LEDs 196 may be adapted to emit red light. The bottom surface 194 of circuit board 144 is the side that faces toward the bottom surface 138 of second extrusion 134 (or alternatively the bottom surface 14 of extrusion 10). If extrusion 134 (or extrusion 10) is comprised of a clear or frosted material, the light emitted from the bottom surface will appear substantially red. Alternatively, if other colors or color combinations are emitted from LEDs 196, the color emitted from a clear or frosted top surface of extrusions 10 or 134 will be substantially the same as that emitted from LEDs 196.

However, in the case of extrusion 120, once the light is emitted through the bottom surface 138 of second extrusion 134, it then passes into the chamber formed by extrusion 120. The light will be dispersed throughout extrusion 120 before it passes through casing 122. Therefore, if the LEDs 196 emit red light as in the example above, the light emitted through casing 122 will appear substantially red if casing 122 is comprised of a clear or transparent red material. However, if the casing is comprised of a different color, the light emitted through casing 122 may be a substantially different color than the light originally emitted from LEDs 196. For example, if the casing 122 is comprised of a transparent yellow material, the light emitted through casing 122 may appear substantially orange. It is understood that any color or combination of colors may be transmitted from extrusion 120 according to the combination of color emitted from LEDs 196 and the color of casing 122.

The bottom surface 194 of circuit board 144 further comprises wires 192 for providing electricity to power the light emitting devices. The wires 192 are incorporated to the bottom of conductive brackets 193, which run through the double-sided circuit board 144 to the top surface 186 of circuit board 144. At the top surface 186, the brackets 193 are adapted to accept the ends 151*a*-151*b* of wire 150 (shown in FIG. 18), with wire 150 attached to an external power supply (not shown).

FIG. 25 depicts a structure 200 utilizing three interconnected extrusions 120, with the curved line 202 representing the break between at least two of the extrusions 120, and the structure sign 204 separating two of the extrusions. The extrusions 120, complete with integral light emitting devices, are mounted and held in low profile against the side surfaces of the roof of structure 200 such that the extrusions 120 are substantially flush against the surface, with any clearance between the extrusions 120 and the surface of structure 200 provided by the length of the trunk 172 of mounting brackets 170. The extrusions 120 are mounted and secured using the mounting brackets 170 described above. The extrusions 120 are positioned such that light emitted through the top surface 142 of second extrusion 134 will provide a backlight onto the surface of the structure 200 behind the mounted extrusions 120 (represented by arrows 208). Light emitted through the bottom surface 138 of second extrusion 134 and the casing 122 will provide illumination out the front of mounted extrusions 120 as represented by hatched portions 206. The light emitted as backlight 208 and the light emitted through casing 122 as depicted by hatching 208 can be two different colors.

For example, the structure 200 may be backlit with yellow light, while the light emitted from the extrusions can be red. Any colors or combination of colors may be achieved.

While there are three extrusions 120 connected in this application, it is understood that any number of extrusions may be connected in numerous configurations. End caps 152 are provided on the ends of extrusions 120 to allow wire(s) 150 to pass through and/or between extrusions 120 and end caps 152. A power device (not shown) is connected to wire(s) 150 to provide power to the connected extrusions 120. It is understood that end caps 152 with wire holes 164 can be provided wherever a wire into and out of an extrusion is desired. End caps 152 without wire holes 164 can be provided on the end of an extrusion 120 at the end of the daisy-chain.

Although the present invention has been described in considerable detail with reference to certain preferred configurations thereof, other versions are possible. The housing/extrusion, mounting clip(s), and/or end cap(s) can be used in many different devices. The extrusion, mounting clip(s), and end cap(s) can also have many different shapes and can be interconnected with one another in many different ways, such as to form channel letters, extrusions to match curved surfaces, and so forth. Accordingly, the spirit and scope of the invention should not be limited to the preferred versions of the invention described above.

We claim:

1. A low profile housing comprising:

a first hollow casing comprising a first surface, a second surface substantially opposite said first surface, and at least one lateral side surface, wherein said casing is substantially light diffusive;

at least one end cap for sealing an end of said casing, wherein said at least one end cap is sized to account for variations in said casing;

one or more electronic devices mounted within said casing, wherein said one or more devices abut at least said first surface; and further wherein said one or more devices comprises a double-sided, cuttable printed circuit board with a plurality of light emitting diodes on both sides, such that light from said diodes may be emitted through both of said first and second surfaces and appear as one continuous light source through both said surfaces.

2. The low profile housing of claim 1, further comprising a mounting means for mounting said housing to an external surface.

3. The low profile housing of claim 1, wherein the wavelength of light emitted from one side of said circuit board may differ from the wavelength of light emitted from the other side of said circuit board.

4. The low profile housing of claim 1, wherein at least a portion of said second surface is substantially smooth and free from extrusion lines and tooling marks on its internal and external surfaces.

5. The low profile housing of claim 1, wherein said casing comprises acrylic.

6. The low profile housing of claim 1, wherein said at least one end cap comprises a substantially flexible and waterproof material.

7. The low profile housing of claim 1, wherein said housing is completely sealed to prevent exposure to external contaminants.

8. The low profile housing of claim 1, wherein said at least one end cap comprises a through-hole for receiving a power cable, wherein the diameter of said through-hole is slightly smaller than the diameter of said cable.

9. A low profile housing comprising:

a first hollow casing comprising a first surface, a second surface substantially opposite said first surface, and at least one lateral side surface, wherein said casing is substantially light diffusive;

at least one end cap for sealing an end of said casing, wherein said at least one end cap is sized to account for variations in said casing;

one or more electronic devices mounted within said casing, wherein said one or more devices abut at least said first surface; and wherein said casing further comprises two external flanges for securing said casing to a mounting means.

10. The low profile housing of claim 9, further comprising a secondary hollow casing co-extruded with said first casing, said secondary casing substantially surrounding all but said second surface of said first casing.

11. The low profile housing of claim 9, wherein said at least one end cap is bonded to said casing using an adhesive.

12. The low profile housing of claim 9, wherein said one or more devices comprises a single-sided, cuttable printed circuit board with a plurality of light emitting diodes, such that light from said diodes may be emitted through said second surface and appear as one continuous light source.

13. A low profile housing comprising:

a first hollow casing comprising a first surface, a second surface substantially opposite said first surface, and at least one lateral side surface, wherein said casing is substantially light diffusive;

at least one end cap for sealing an end of said casing, wherein said at least one end cap is sized to account for variations in said casing;

one or more electronic devices mounted within said casing, wherein said one or more devices abut at least said first surface; and wherein said at least one end cap comprises a protruding surface that corresponds with at least a portion of the internal surface of at least one end of said casing, wherein said protruding surface comprises a bonding surface along its perimeter.

14. The low profile housing comprising:

a first hollow casing comprising a first surface, a second surface substantially opposite said first surface, and at least one lateral side surface, wherein said casing is substantially light diffusive;

at least one end cap for sealing an end of said casing, wherein said at least one end cap is sized to account for variations in said casing;

one or more electronic devices mounted within said casing, wherein said one or more devices abut at least said first surface; and wherein said at least one end cap comprises a surface that corresponds with and is slightly larger than the external surface of at least one end of said casing, wherein said surface comprises a bonding surface that corresponds with said external surface of said at least one end.

15. A low profile extrusion comprising:

a hollow casing comprising a first surface, a second surface opposite said first surface that is substantially free of lines and tooling marks, and at least one lateral side surface, wherein said casing is substantially light-diffusive;

end caps for sealing the ends of said casing, wherein at least one of said end caps comprises a through-hole for receiving a cable, said through-hole having a diameter smaller than the diameter of said cable;

one or more light emitting diodes (LEDs) mounted within said casing; and a mounting means for mounting said extrusion and securing it in low profile with respect to a mounting surface.

16. A low profile housing comprising:

a first elongated hollow casing comprising a top surface and a bottom surface, wherein said casing is substantially light diffusive;

a second elongated and substantially hollow casing surrounding all but said top surface of said first casing;

at least one end cap for sealing an end of said first casing;

one or more light emitting devices mounted within said first casing; and further comprising a mounting means for mounting said housing to an external surface, wherein said mounting means comprises a base portion with two flanges extending in opposite directions from said base portion.

17. The low profile housing of claim 16, wherein said first and second casing are co-extruded with one another.

18. The low profile housing of claim 16, wherein said second housing further comprises two external L-shaped extensions, with said flanges are adapted to fit under said L-shaped extensions to secure said mounting means to said housing.

19. The low profile housing of claim 16, wherein said at least one end cap is a silicone plug adapted to prevent external contaminants from entering said first casing.

20. The low profile housing of claim 16, wherein said one or more devices comprise a single-sided printed circuit board with a plurality of light emitting diodes, such that light from said diodes may be emitted through said top and/or bottom surface and appear as one continuous light source.

21. The low profile housing of claim 16, wherein said one or more devices comprise a single- or double-sided printed circuit board that is cuttable along its length.

22. The low profile housing of claim 16, wherein said second casing comprises at least one end cap, wherein said end cap is sized to account for variations in said second casing.

23. The low profile housing of claim 16, wherein said first casing comprises acrylic.

24. The low profile housing of claim 16, wherein said second casing comprises a transparent colored plastic.

25. A low profile housing comprising:

a first elongated hollow casing comprising a top surface and a bottom surface; wherein said casing is substantially light diffusive;

a second elongated and substantially hollow casing surrounding all but said top surface of said first casing;

at least one end cap for sealing an end of said first casing;

one or more light emitting devices mounted within said first casing; and wherein said one or more devices comprise a double-sided printed circuit boards with a plurality of light emitting diodes on both sides, such that light from said diodes may be emitted through both of said top and bottom surfaces and appear as one continuous light source though both said surfaces.

26. The low profile housing of claim 25, wherein said the wavelength of light emitted from one side of said circuit board may differ from the wavelength of light emitted from the other side of said circuit board.

27. The low profile housing comprising:

a first elongated hollow casing comprising a top surface and a bottom surface, wherein said casing is substantially light diffusive;

a second elongated and substantially hollow casing surrounding all but said top surface of said first casing;

at least one end cap for sealing an end of said first casing;

one or more light emitting devices mounted within said first casing; and wherein said one or more devices comprise a single- or double-sided printed circuit board that is cuttable along its length and wherein said cuttable printed circuit boards comprise lines that are visible through said first casing, said lines indicating where said circuit boards may be cut without damaging the underlying drive circuitry of adjacent portions of said circuit boards.

28. The low profile housing comprising:

a first elongated hollow casing comprising a top surface and a bottom surface, wherein said casing is substantially light diffusive;

a second elongated and substantially hollow casing surrounding all but said top surface of said first casing;

at least one end cap for sealing an end of said first casing;

one or more light emitting devices mounted within said first casing; and wherein said second casing comprises at least one end cap, wherein said end cap is sized to account for variations in said second casing and wherein said end cap further comprises a T-shaped gasket, with said gasket forming a seal with said end cap via perpendicular force, wherein said gasket further provides a watertight seal at the end of said second casing.

29. A low profile housing comprising:

a first elongated hollow casing comprising a top surface and a bottom surface;

a second elongated and substantially hollow casing surrounding all but said top surface of said first casing;

one or more double-sided printed circuit boards mounted within said first casing;

a plurality of light emitting diodes on each side of said one or more double-sided circuit boards, wherein light emitted from an upper side of said circuit boards transmits through said top surface of said first casing, and light emitted from a bottom side of said circuit boards transmits through said bottom surface of said first casing and through said second casing, with the wavelength of light emitting from said top surface differing from the wavelength of light emitting from said second casing.

* * * * *

UNITED STATES PATENT AND TRADEMARK OFFICE

CERTIFICATE OF CORRECTION

PATENT NO. : 8,083,370 B2
APPLICATION NO. : 12/454101
DATED : May 11, 2010
INVENTOR(S) : Thomas C. Sloan It is certified that error appears in the above-identified patent and that said Letters Patent is hereby corrected as shown below:

Col. 20, Claim 26, Line 4, please delete the word “said”

Signed and Sealed this
Sixth Day of March, 2012

David J. Kappos
*Director of the United States Patent and Trademark Office*